United States Patent [19]

Ely

[11] Patent Number: 4,754,160
[45] Date of Patent: Jun. 28, 1988

[54] POWER SUPPLY SWITCHING CIRCUIT

[75] Inventor: Glenn L. Ely, San Jose, Calif.

[73] Assignee: Intersil, Inc., Cupertino, Calif.

[21] Appl. No.: 725,216

[22] Filed: Apr. 19, 1985

Related U.S. Application Data

[63] Continuation-in-part of Ser. No. 644,135, Aug. 23, 1984, which is a continuation of Ser. No. 511,128, Jul. 6, 1983, abandoned.

[51] Int. Cl.⁴ .............................................. H02J 7/00
[52] U.S. Cl. ........................................ 307/64; 307/66; 365/229
[58] Field of Search ...................... 307/64, 66; 365/229

[56] References Cited

U.S. PATENT DOCUMENTS 4,288,865  9/1981  Graham ............................ 307/64 X
4,463,270  7/1984  Gordon ............................ 365/229 X
4,492,876  1/1985  Colbert et al. ........................ 307/66

Primary Examiner—William M. Shoop, Jr.
Assistant Examiner—Sharon D. Logan
Attorney, Agent, or Firm—Stanley C. Corwin; Birgit E. Morris; Henry I. Schanzer

[57] ABSTRACT

A power supply switching circuit is disclosed which provides for automatically switching an electrical circuit load from a main power source to an auxiliary power source, yet maintains the two power sources isolated from each other. The power supply switching circuit is readily integrated with its electrical load to form a monolithic integrated circuit. A pair of MOSFETs provides alternate connections of the load to the respective power sources. The circuit effectively connects the gate and source of the appropriate MOSFET across the available power source and thus assures the maximum turn-on voltage is applied to the MOSFET.

22 Claims, 5 Drawing Sheets

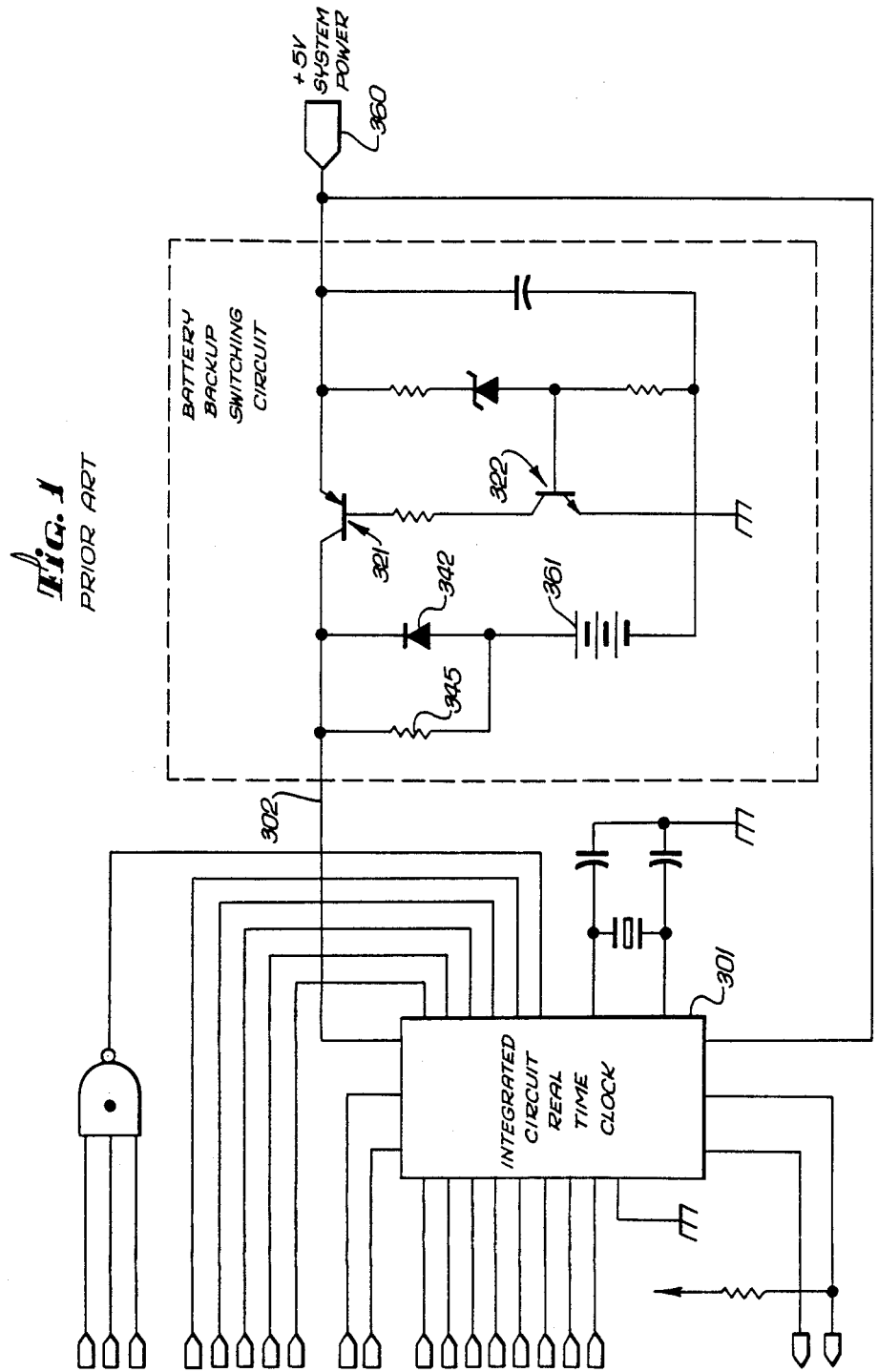

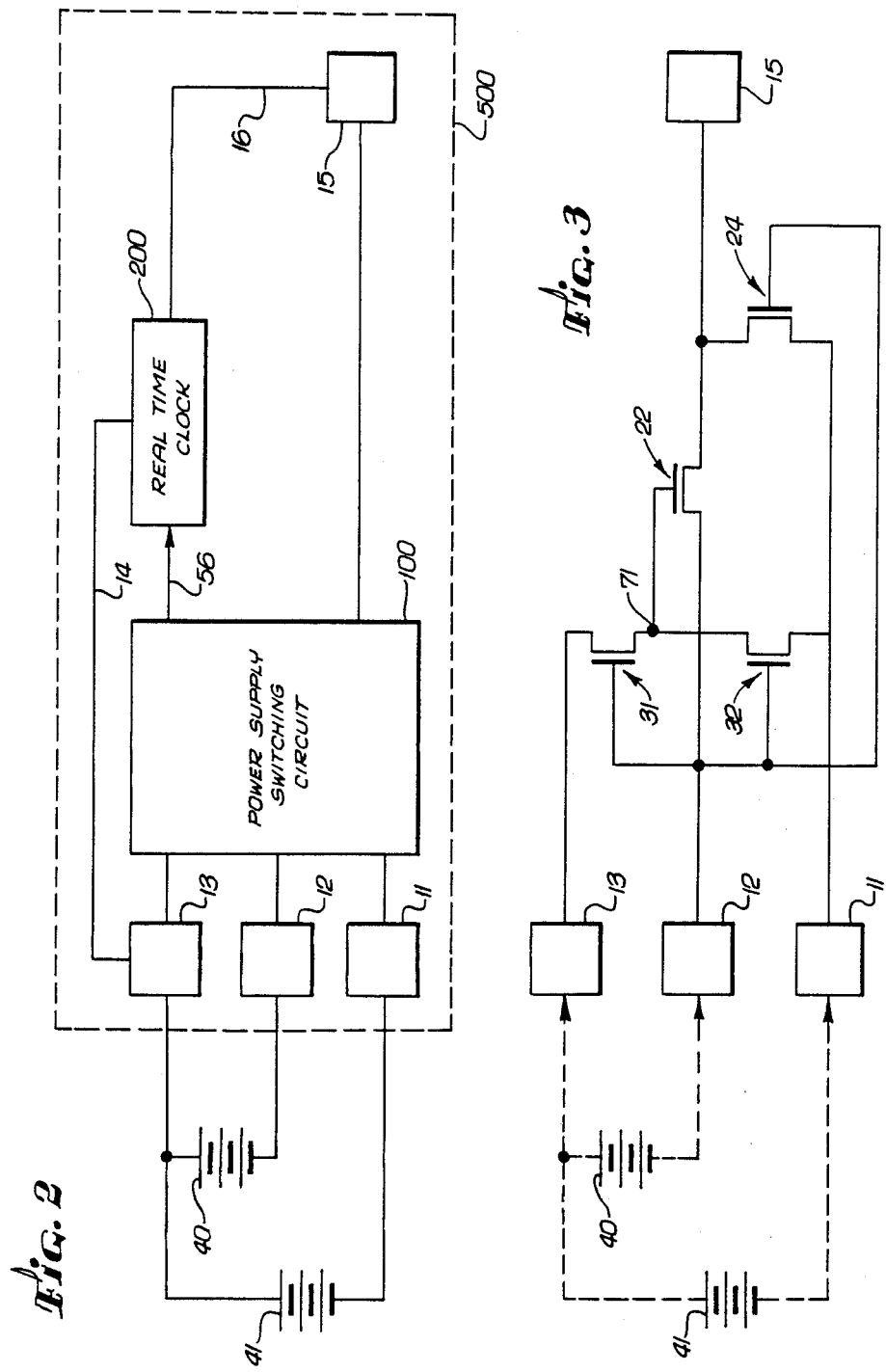

POWER SUPPLY SWITCHING CIRCUIT

This is a continuation-in-part of Ser. No. 06/644,135 filed Aug. 23, 1984 which is a continuation of Ser. No. 06/511,128 filed July 6, 1983 abandoned.

The present invention relates in general to power supply switching circuits, and in particular to a device for providing automatic switching as a function of detected voltage levels.

BACKGROUND OF THE INVENTION

Power supply switching circuits are employed in many different applications, e.g. where the interruption of power from a particular power supply is a foreseeable event and an alternative source of power must be switched into operation in its place. Prior art switching circuits exist which are assembled from discrete components. Such circuits may be interposed between a load and the power sources, or they may themselves include an auxiliary power source. Although these circuits provide effective and power-efficient solutions to the problem, they generally employ bipolar junction transistors which cannot be integrated with CMOS processes. Additionally, such circuits generally employ capacitors and other components that are relatively difficult to integrate.

Real time clocks are among a variety of loads to which it is desirable to provide continuous power. Such clocks typically comprise power-consuming oscillators and memories. They may be used simply to provide data for a display of current time, or they may be employed to provide a timing mechanism for initiating various functions in different kinds of environments. Such clocks are required to remain in continuous operation, even when the system in which the clock is employed is not operating, so that the clock's normal power source may be turned off.

In the prior art as well as in the present invention, low power batteries provide a power source to such clocks when regular system power is off. This arrangement supplies to only those components which are required to track current time and thus power consumption is minimized. However, many prior art circuits permit a small current flow from regular system power to the batteries. Such a charging feature is undesirable when battery power is provided by certain types of long-life batteries, e.g. lithium batteries.

Real time clocks of the type described typically consist of integrated circuits. Ideally, the power supply switching circuit (though not the power supplies themselves) is located on the same chip as the load, e.g. the clock serviced by the power supply. Also, the switching circuit should be of minimum size. Current carrying elements in the circuit should be both of relatively low resistance and minimum size. Among the advantages of such a monolithic, integrated arrangement versus a system arrangement, are savings of space on the chip, reduced cost and improved quality control in the manufacturing process. However, for the reasons discussed above and because space on an integrated chip is typically at a premium, it has not been possible to date to integrate these components, except at excessive cost.

OBJECTS OF THE INVENTION

It is a primary object of the present invention to provide new and improved power supply switching circuits which avoid the disadvantages associated with prior art circuits of this type.

It is an additional object of the present invention to provide a new and improved power supply switching circuit which isolates the auxiliary power supply from the main power supply.

It is another object of the present invention to provide a new and improved power supply switching circuit which, together with the load serviced by the power supply, can be fabricated as a single, monolithic, integrated circuit chip.

It is a further object of the present invention to provide a new and improved, integrated power supply switching circuit of reduced cost and of relatively compact size.

It is still another object of the present invention to provide a new and improved MOSFET power supply switching circuit which can be fabricated using n-channel, p-channel, p-well CMOS, or n-well CMOS architectures.

It is yet a further object of the invention to provide a new and improved MOSFET power supply switching circuit which provides maximum turn-on voltages to current-carrying MOSFETs in order to allow the MOSFETs to be of minimum size.

It is yet another object of this invention to provide a power supply switching circuit that can function properly with batteries that have open circuit voltages that are significantly greater than the closed circuit voltage of the battery (i.e., when a load is connected across the battery).

SUMMARY OF THE INVENTION

The present invention achieves the foregoing objects by means of a switching circuit which provides separate current paths from one of at least two input terminals to a single output terminal. The invention permits access to one of two separate sources of power, one at a time, each source of power being connected to a separate one of the aforesaid input terminals.

In a preferred implementation of the present invention two power switching MOSFETs are employed, one in each of the two current paths, and they are turned on and off in response to the relative polarities of the voltages appearing on the two input terminals. The shutting down of the regular or main system power source, or its failure, will produce a relative change of polarity of the potential on the input terminals. This change of polarity turns on one MOSFET to connect the load across the auxiliary power source, while turning off the other MOSFET to break the connection of the load across the regular system power source. Restoration of regular system power will restore the first MOSFET to conduction, while cutting off the second MOSFET. Thus, the load is again connected across regular system power and the auxiliary power source is isolated from the regular system power source.

The present invention minimizes the amount of space the power supply switching circuit requires on the chip, while allowing ready integration of the circuit. Thus, the invention obtains the fullest advantage from the use of integrated components.

These and other objects of the invention, together with the features and advantages thereof, will become apparent from the following detailed specification, when read together with the accompanying drawings in which applicable reference numerals have been carried forward.

BRIEF DESCRIPTION OF THE DRAWINGS

FIG. 1 a prior art power supply switching circuit which utilizes discrete circuit components.

FIG. 2 in block diagram form a single chip containing a power supply switching circuit in accordance with the present invention, as well as the load serviced by the power supply and other circuit components.

FIG. 3 shows one embodiment of a power supply switching circuit in accordance with the present invention.

DETAILED DESCRIPTION OF THE INVENTION

Figure 4:
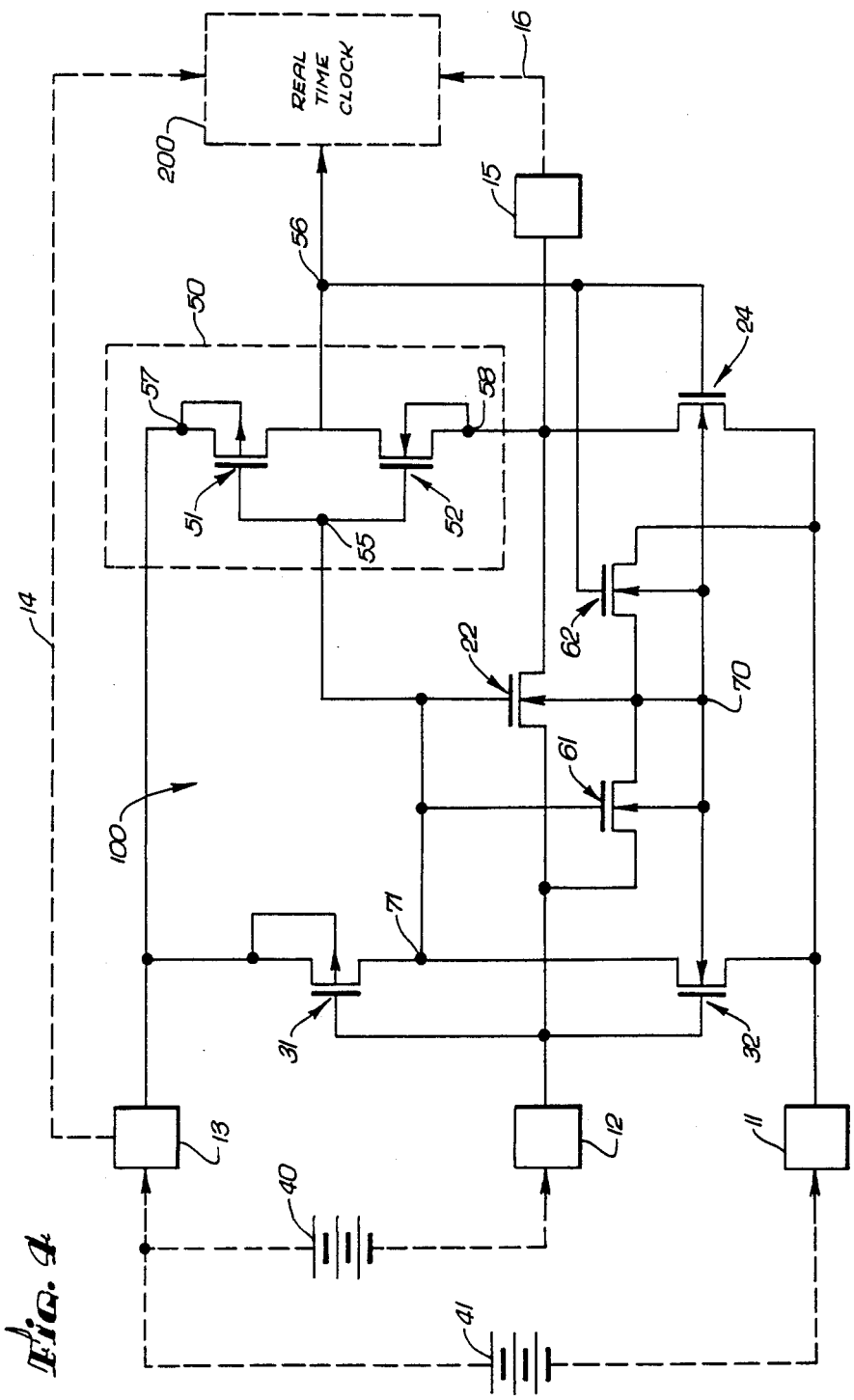
FIG. 4 shows a preferred embodiment of the present invention using n-channel body switches in p-well architecture.

Referring now to the drawings, FIG. 1 illustrates a prior art power supply switching circuit which is capable of switching the load to a back-up power supply when required. The prior art circuit appears in an article by S. Ciarcia, Byte, "Everyone Can Know The Real Time," Vol. 7, No. 5, May 1982, pps. 34-58. As shown, the device is constructed from discrete components which are external to an integrated circuit real time clock, the latter being disposed on a chip 301. A system power potential of 5 volts is normally available at input 360 to power the chip.

In operation, the base of an npn transistor 322 is driven high with respect to the emitter of the same transistor, so as to turn the transistor on. This action connects the base of a pnp transistor 321 to ground and leaves the base of the latter transistor negative with respect to its emitter. Transistor 321 is thus driven into conduction and connects input 360 to an input terminal 302 on chip 301. Diode 342 and resistor 345 act to partially isolate a battery 361 from system power and the chip. Battery 361 has a potential of approximately 3 volts. Should system power fail, or be turned off, the base-to-emitter voltage on transistor 322 will fall to zero and cut transistor 322 off. This action, in turn, disconnects the base of transistor 321 from ground and turns transistor 321 off. Battery 361 can then supply chip 301 via diode 342 and input terminal 302.

FIG. 2 illustrates in block diagram form the integrated power supply switching circuit which constitutes the subject matter of the present invention. As shown, the circuit is disposed on a single integrated chip 500, together with a real time clock 200. Input terminals 11 and 12, as well as a reference terminal 13, are brought to one edge of the chip as externally accessible pins. Either terminal 11 or 13 may serve as a voltage reference terminal.

Terminals 11, 12 and 13 are connected to circuit 100. A regular source of system power, shown as a first DC power supply 41, is connected with its anode to terminal 13 and its cathode to terminal 11. An auxiliary power source, shown as a second DC power supply 40, is connected with its anode to reference terminal 13 and its cathode to terminal 12. An output terminal 15 of circuit 100 may be brought to an externally accessible pin, if desired. A "power down" lead 56 connects power switching circuit 100 to real time clock 200. Clock 200 is connected to reference terminal 13 by way of a conductive path 14. The real time clock is also connected to output terminal 15 by an additional conductive path 16.

When power source 41 is on, output terminal 15 is connected through the power supply switching circuit to input terminal 11. Thus, real time clock 200 is connected between input terminal 11 and reference terminal 13 and receives power. When power source 41 is off, or not available, power supply switching circuit 100 detects a change in the relative polarities of the potential on input terminals 11 and 12 and connects output terminal 15 through the power supply switching circuit to input terminal 12. This action connects the real time clock between input terminals 12 and reference terminal 13 and thus prevents a loss of power to the clock by providing it with auxiliary power.

With respect to the following specific embodiments of the invention, the terminals of a MOSFET will be referred to as source, gate, drain, and body. These terms do not necessarily imply that either source or drain is at a potential higher or lower than the other, nor that any potential difference exists between the terminal called source and the gate on the body. Furthermore, the term source does not imply any direct or indirect connection to the body of the MOSFET. Moreover, depending upon the connection of the body, either side of the MOSFET can serve as source or drain.

Referring now to FIG. 3, power supplies 40 and 41 are connected to input terminals 11 and 12 and to reference terminal 13 substantially in the same manner as described with respect to FIG. 2. In a preferred embodiment of the invention, power supplies 40 and 41 provide voltages of 3 volts and 5 volts respectively. A first MOSFET 24 consists of an enhancement mode, n-type device which operatively connects output terminal 15 to input terminal 11. The source and drain of MOSFET 24 are connected to terminals 11 and 15 respectively. The gate of MOSFET 24 is connected to input terminal 12. A second MOSFET 22 consists of an enhancement mode, n-type device which operatively connects output terminal 15 to input terminal 12. The source and drain are connected to terminals 12 and 15 respectively. The gate of MOSFET 22 is tied to a junction 71. MOSFETs 22 and 24 are the power switching means in the circuit and accordingly each is constructed to be a minimum impedance device.

Third and fourth MOSFETs 32 and 31 are shown connected in series across input terminal 11 and reference terminal 13. Each of the last-recited MOSFETs has its source connected to the corresponding terminal and its drain connected to junction 71. The gates of MOSFETs 31 and 32 are connected to input terminal 12. MOSFET 32 is an enhancement mode, n-channel switching device, while MOSFET 31 is an enhancement mode, p-channel device. MOSFET 31 is constructed so that it will have a resistive value from source to drain in its operative state that is at least an order of magnitude greater than the resistive value from drain to source of MOSFET 32 in the operative state of the latter.

The operation of the circuit shown in FIG. 3 is as follows. As long as the main DC power source 41 is available, i.e. as long as it remains operative and connected between terminals 11 and 13, the potential on input terminal 11 relative to the potential on reference terminal 13 will be 5 volts negative. The potential on input terminal 12 relative to reference terminal 13 will be 3 volts negative. Accordingly, the voltage applied to the source of MOSFET 31 will be approximately 3 volts positive with respect to the voltage on its gate. Hence, MOSFET 31 will conduct so as to connect junction 71 to reference terminal 13. Concurrently, MOSFET 32 is also in an operative state inasmuch as the source of MOSFET 32 will be 2 volts negative with respect to its gate. Thus, MOSFET 32 will conduct so as to connect junction 71 to input terminal 11.

MOSFETs 31 and 32 together act as a voltage divider when both are operative, i.e. when both conduct. Because MOSFET 31 has a conductance of less than 1/10 that of MOSFET 32, the potential of the signal appearing at junction 71 will be relatively close to the potential appearing on input terminal 11, i.e. approximately 4½ volts negative with respect to reference terminal 13 in one example. Because the gate of MOSFET 22 is connected to junction 71, and the source of MOSFET 22 is connected to input terminal 12, the gate of MOSFET 22 will be more negative than its source and hence MOSFET 22 will not conduct during this interval. However, n-channel MOSFET 24 has its gate connected to input terminal 12 and its source to input terminal 11. Consequently, its gate will be positive with respect to its source and thus MOSFET 24 will conduct and thereby connect input terminal 11 to output terminal 15. Accordingly, an electrical load connected between terminals 13 and 15 is effectively connected between input terminal 11 and reference terminal 13.

When system power is turned off, or if system power fails, the value of the potential on input terminal 11 will rise to approximately the reference value, i.e. the potential of reference terminal 13. This will, in turn, leave the potential on input terminal 12 approximately 3 volts below the potential on both input terminal 11 and reference terminal 13. As noted above, the potential on input terminal 12 is 3 volts more negative than the potential on the reference terminal. Hence, MOSFET 31 remains conductive and couples junction 71 to reference terminal 13. However, MOSFETs 24 and 32, having gates tied to input terminal 12 and sources connected to input terminal 11, will each exhibit a drop in potential from source to gate. Thus, MOSFETs 24 and 32 will be biased into cutoff. With MOSFET 32 in a cutoff condition, the potential on the gate of MOSFET 22 will be that of the reference terminal. Since the source of MOSFET 22 is connected to input terminal 12, its gate will be positive with respect to its source. This will drive MOSFET 22 into conduction, thereby connecting input terminal 12 through MOSFET 22 to output terminal 15. Accordingly, a load connected between terminals 13 and 15 will be effectively connected between terminals 12 and 13 and receive power from auxilary power source 40.

FIG. 4 illustrates a preferred embodiment of the invention which incorporates portions of the circuit of FIG. 3 described above. Discussion of these circuit portions is therefore not repeated below. In addition to the elements included in the latter circuit, the embodiment illustrated in FIG. 4 further comprises first and second n-channel MOSFET body switches 61 and 62 and a CMOS inverter 50. In the preferred embodiment of FIG. 4, MOSFETs 22, 24 and 32, as well as body switches 61 and 62, share a common body, i.e. they may be fabricated in a common well. This is schematically indicated in the drawing by junction 70. This type of architecture reduces manufacturing costs as well as reducing the space required by those components on a chip. The sources of body switches 61 and 62 are shorted to the common body. This is indicated in the drawing by the connections of these sources to junction 70. The drain of body switch 61 is connected to the source of MOSFET 22 and terminal 12. The drain of body switch 62 is connected to the sources of MOSFETs 24 and 32 and terminal 11. The gate of switch 61 is tied to the gate of MOSFET 22 and to junction 71.

CMOS inverter 50, which is indicated by a broken line block in FIG. 4, is connected across reference terminal 13 and output terminal 15. An inverter input terminal 55 is connected to junction 71. A first inverter output terminal, or "power down" lead, is designated by the reference numeral 56 and is connected to the gates of MOSFET 24 and body switch 62. A first inverter power supply terminal 57 is connected to reference terminal 13. A second inverter power supply terminal 58 is connected to output terminal 15.

Inverter 50 comprises a p-channel MOSFET 51 and an n-channel MOSFET 52. The drain of MOSFET 51 and the drain of MOSFET 52 are jointly connected to output terminal 56. The source of MOSFET 51 is connected to first inverter power supply terminal 57 while the source of MOSFET 52 is connected to second inverter power supply terminal 58. The gates of both MOSFETs are connected to inverter input terminal 55. The gate of MOSFET 24 is connected to output terminal 56 of CMOS inverter 50, instead of input terminal 12, as was the case in FIG. 3. Output terminal 56 also provides a "power down" signal to real time clock 200, i.e. a signal indicating that system power has been turned off, or has failed.

Figure 5:
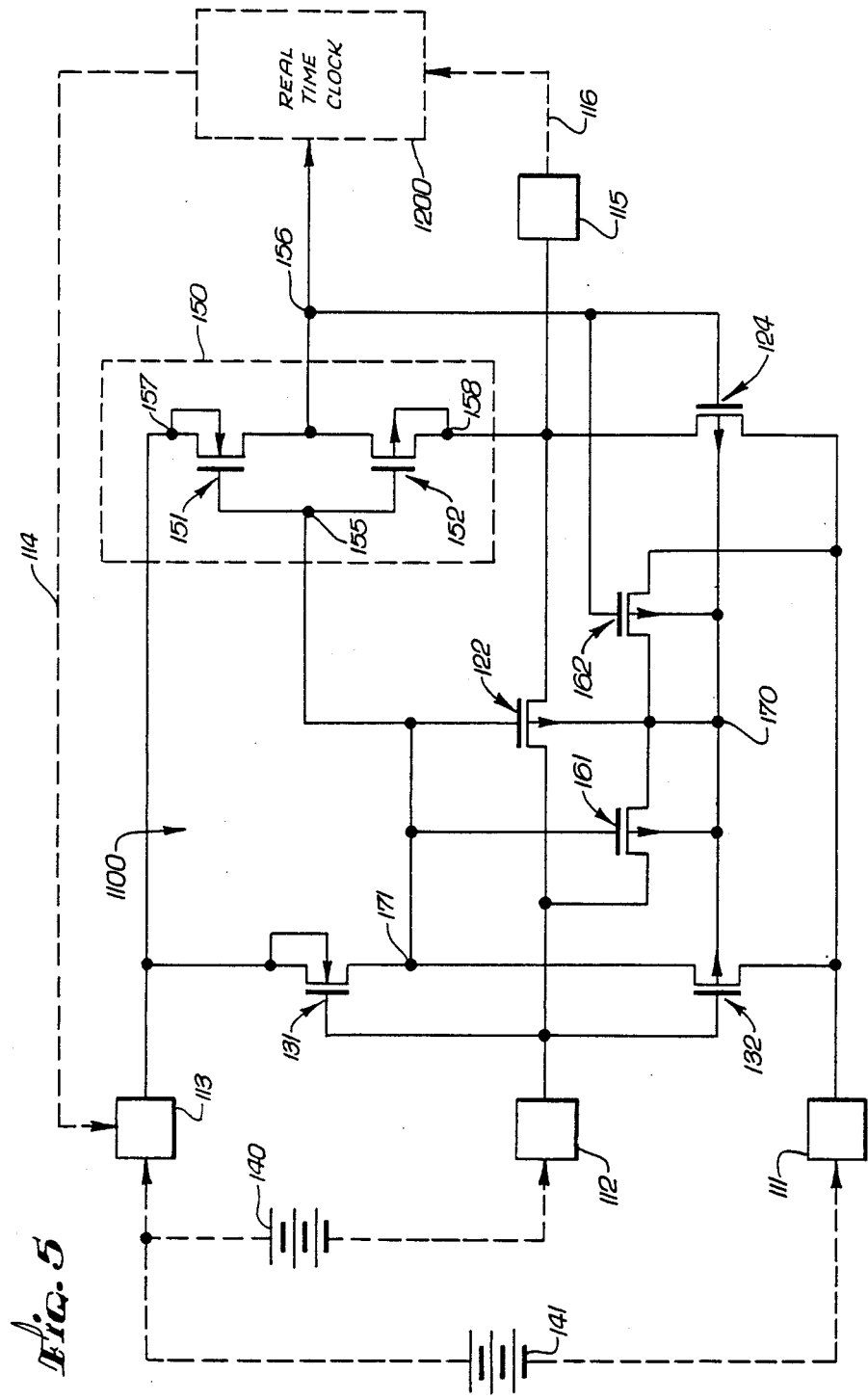
FIG. 5 shows another embodiment of the present invention, similar to FIG. 4, but using p-channel body switches in n-well architecture.

It will be understood that the polarity of the power sources and the conductivity type of the MOSFETs in the above-discussed embodiments of FIGS. 3 and 4 may be reversed if desired. That is to say, p-channel n-well MOSFETs may be substituted for n-channel p-well MOSFETs and vice versa. Under certain conditions the latter arrangement may be preferred. P-well architecture can provide faster switching but is more expensive to fabricate. The circuit of FIG. 5, showing such a substitution of conductivity type MOSFETs, is therefore substantially analogous to the circuit of FIG. 4 and thus needs no further discussion. The reference numerals in FIG. 5 differ from those of FIG. 4 for like components only by the addition of the "100" prefix.

With respect to MOSFETs 22, 31 and 32, the operation of the circuit shown in FIG. 4 is substantially the same as that of the circuit of FIG. 3 and therefore requires no reiteration The remainder of the circuit operates as follows. When DC power supply 41 is available, input terminal 11 will be held at a value of 5 volts below reference terminal 13. Input terminal 12 will have a potential imposed thereon by DC power supply 40 which is approximately 3 volts below reference terminal 13. As described above, the signal at junction 71 will be at a potential close to that on terminal 11. Consequently, the gate of p-channel MOSFET 51 in inverter 50 will be negative with respect to its source, thereby biasing MOSFET 51 into conduction. The gate of n-channel MOSFET 52 will also be negative with respect to its source, consequently biasing MOSFET 52 off. Thus, the gates of MOSFET 24 and substrate switch 62 will be connected to reference terminal 13 through CMOS inverter 50. The source-to-gate voltages of each of substrate switch 62 and MOSFET 24 will be positive, turning both the switch and the MOSFET on. This arrangement substantially increases the potential difference from gate to source of MOSFET 24 compared with that of the circuit shown in FIG. 3.

Because MOSFET 22 and MOSFET 24 carry significant currents in their respective operative states, it is important that their respective resistive values, when these MOSFETs are on, be minimized. In accordance with the present invention, the potential between gate and source of the conducting, power-carrying MOSFET, i.e. the turn-on voltage of the MOSFET, is increased to a maximum. This allows MOSFET 24 to be reduced in size without any increase in resistivity over the circuit shown in FIG. 3. As a consequence, notwithstanding the fact that the circuit of FIG. 4 requires additional circuit components as compared to the circuit of FIG. 3, an overall reduction in the amount of space occupied on the chip, is achieved.

When power supply 41 is off, MOSFET 32 will be driven into cutoff and the signal on junction 71 will rise to the value on the reference terminal, as described above for the embodiment of FIG. 3. This action will, in turn, reduce the potential drop from source to gate of MOSFET 51 below its threshold value, thereby cutting it off. As the potential on junction 71 rises, so also will the potential on the gate of MOSFET 22 rise. Because the source of MOSFET 22 is connected to input terminal 12, MOSFET 22 will be driven into conduction, as described above with reference to FIG. 3.

The source of MOSFET 52 is now connected to input terminal 12 through MOSFET 22 and consequently MOSFET 52 will turn on. The gates of MOSFET 24 and of body switch 62 will be connected to input terminal 12 through CMOS inverter 50 and MOSFET 22. This will leave the gates of MOSFET 24 and switch 62 negative with respect to their sources, thereby cutting both the MOSFET and the switch off. At this point of the operation, output terminal 15 is cut off from input terminal 11 and is connected to input terminal 12. Since the gate of body switch 61 is tied to the gate of MOSFET 22, the MOSFET and the body switch will turn on simultaneously.

The inclusion of body switches 61 and 62 allows MOSFETs 22, 24 and 32, as well as the body switches to share a common body. Since body switch 62 conducts simultaneously with MOSFETs 24 and 32 and body switch 61 conducts simultaneously with MOSFET 22, forward biasing of the intrinsic pn junctions of the conducting MOSFETs is avoided without spurious short circuits developing through the common body.

The operation of the embodiment of FIG. 5 is analogous to the operation of FIG. 4 and therefore needs no separate discussion or reiteration.

Figure 6:
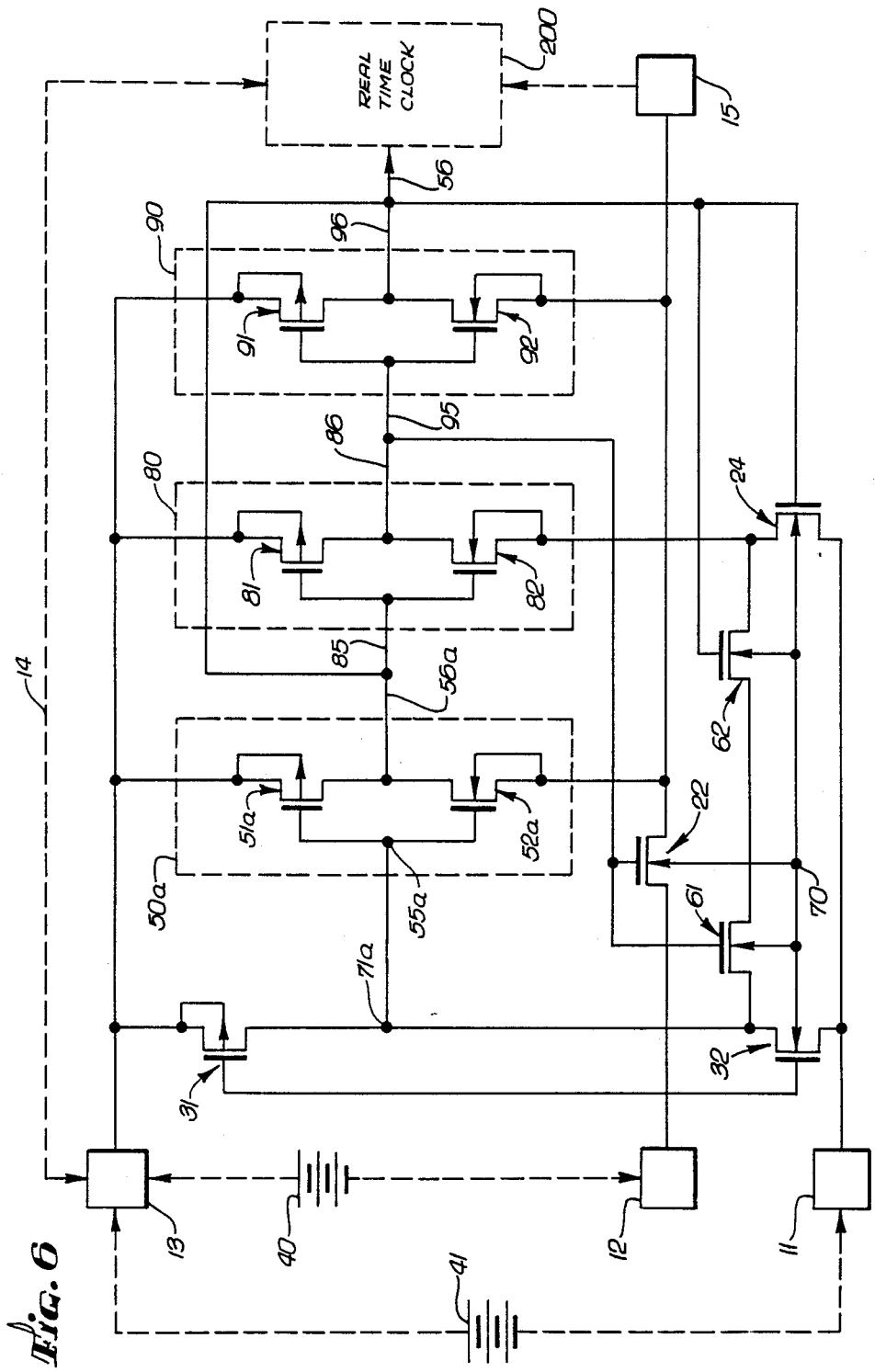
FIG. 6 shows another embodiment of the present invention, which is similar to FIG. 4, but uses additional elements to ensure proper operation when the battery open circuit voltage may be substantially greater than the closed circuit voltage.

The circuit shown in FIG. 6 is directed to ensuring proper operation in certain situations: (i) if the open circuit voltage of auxiliary power supply 40 is substantially greater than the closed circuit voltage of the auxiliary power supply 40; or (ii) if the output voltage of the main power supply 41 does not increase rapidly when that main power supply 41 is again connected to the circuit—e.g., the main power supply 41 is controlled by a rheostat. For example, when the auxiliary power supply 40 is connected to the circuit shown in FIG. 4, the amplitude of the voltage at the junction 71 will increase (with respect to the reference terminal 13) relatively slowly. As a result, MOSFET 24 may turn on, connecting the main power supply 41 to the drain of MOSFET 22 before MOSFET 22 turns off, disconnecting the auxiliary power supply 40. As a result, the main power supply 41 may charge the auxiliary power supply 40 and simultaneously start biasing the gate of MOSFET 32 back towards cutoff; MOSFET 32 may then turn off but MOSFET 22 may still remain turned on—the result being auxiliary power supply 40 is being charged and the power down lead 56 will also falsely indicate that the main power supply 41 remains inoperable.

However, the circuit shown in FIG. 6 (with like elements labelled with the same number), solves this problem by adding a noninverting coupling means comprising of inverters 50a and 80 connected in series between the gate of MOSFET 22 and the junction 71a. An optional feedback inverter 90 is also included and it should be noted that all three inverters 50a, 80 and 90 function in the same manner as inverter 50 described above, i.e., the outputs 56a, 86, 96 of the inverters 50a, 80 and 90 will transition between a voltage level approximately equal to the voltage level at the reference terminal 13 and a voltage level approximately equal to the voltage level at the output terminal 15. Because inverters 50a, 80 and 90 have a gain that theoretically approaches infinity, each inverter's output (56a, 86 and 96) will make a rapid transition between those two levels. Although feedback inverter 90 is not necessary, the inverter 90 hastens the speed at which the output 86 of inverter 80 transitions between the two voltage levels.

Thus, as MOSFET 32 starts to conduct when power supply 41 is reconnected, the output of inverter 50a will rapidly transition from a voltage approximately equal to the voltage level at input terminal 12 to a voltage level approximately equal to the voltage level at reference terminal 13—thereby turning on MOSFET 24 and connecting input terminal 11 to output terminal 15. Within an exceedingly short time span (e.g., less than a microsecond) the output 86 of inverter 80 will rapidly transition from a voltage approximately equal to the voltage at reference terminal 13 to the voltage at input terminal 12—thereby turning off MOSFET 22 and disconnecting input terminal 12 from output terminal 15. Thus, within a time period of less than a micro-second, MOSFET 22 turns on while MOSFET 24 turns off. This allows MOSFET 32 to remain conducting. Accordingly, the auxiliary power supply 40 is rapidly disconnected and is not charged by the main power supply 41.

And although it is not shown, it is obvious a similar modification incorporating the differences between FIGS. 4 and 6 could be done for the n-well architecture shown in FIG. 5.

In the exemplary embodiments of the invention described above and shown in FIGS. 4, 5 and 6, real time clock 200 constitutes the load which is switched between a primary and an auxiliary power source. It will be readily apparent that the invention is not so limited and that it may be used as a reliable power switching device with different kinds of loads. For example, the circuit may be monolithically integrated with memory circuits. In such an application, information can be efficiently preserved during "power down" cycles in a microprocessor. Various substitutions and modifications may also be made in the type of components used. For instance, power supplies and transistors that are different from those shown and described may be used within the scope of the present invention.

While certain embodiments of the present invention have been disclosed herein, it will be clear that numerous modifications, variations, substitutions, changes and full and partial equivalents will now occur to persons skilled in the art without departing from the spirit and scope of the invention herein. Accordingly, it is intended that the invention be limited only by the spirit and scope of the appended claims.

What is claimed is:

1. In a power supply switching circuit:
   at least first, second and third MOSFETs of a first conductivity type, each of said MOSFETs including a control electrode, an output electrode and an input electrode;
   a reference terminal adapted to provide a reference potential;
   a first input terminal coupled to the input electrodes of said first and third MOSFETs;
   a second input terminal coupled to the input electrode of said second MOSFET and the control electrode of said third MOSFET;
   an output terminal coupled to the output electrodes of said first and second MOSFETs;
   means for applying a first unidirectional voltage to said first input terminal;
   means for applying a second unidirectional voltage to said second input terminal, said second unidirectional voltage having the same polarity relative to said reference terminal as said first unidirectional voltage but having a different amplitude;
   the control electrode of said second MOSFET being coupled to the output electrode of said third MOSFET to form a junction;
   means for coupling said junction to said reference terminal, said coupling means having a substantially higher impedance than said third MOSFET in the respective operative condition of each; and
   means for applying an electrical signal to the control electrode of said first MOSFET;
   whereby, in dependence on the relative polarities of the voltages on said first and second input terminals, said first or said second MOSFET is driven into conduction to couple said output terminal to said first or said second input terminal respectively.

2. A power supply switching circuit as set forth in claim 1 wherein said coupling means comprises a MOSFET of a second conductivity type, said last-recited MOSFET including an input electrode connected to said reference terminal, an output electrode connected to said junction, and a control electrode connected to said second input terminal;
   whereby said last-recited MOSFET remains conductive regardless of the relative amplitudes of the voltages of said first and second input terminals.

3. A power supply switching circuit as set forth in claim 2 and further comprising a CMOS inverter, said inverter including:
   a first inverter power supply terminal coupled to said reference terminal;
   a second inverter power supply terminal connected to said output terminal of said circuit;
   an inverter input terminal coupled to said junction; and
   an inverter output terminal connected to the control electrode of said first MOSFET;
   whereby said electrical signal applied to said control electrode of said first MOSFET is provided by said inverter.

4. An integrated power supply switching circuit for automatically substituting an auxiliary power supply when the main power supply becomes unavailable to service its electrical load, said circuit comprising:
   first and second input terminals adapted to be energized by said main and auxiliary power supplies respectively, said main power supply being adapted, when available, to apply a potential to said first input terminal of the same polarity but of substantially greater magnitude than the potential applied to said second input terminal by said auxiliary power supply;
   an output terminal adapted to be connected to said load;
   a reference terminal adapted to provide a reference voltage level;
   a first MOSFET of a first conductivity type including a gate electrode, an input electrode connected to said first input terminal, and an output electrode connected to said output terminal;
   a second MOSFET of said first conductivity type including a gate electrode, an input electrode connected to said second input terminal, and an output electrode connected to said output terminal;
   a third MOSFET of said first conductivity type including an output electrode connected to the gate electrode of said second MOSFET to form a junction, an input electrode connected to said first input terminal, and a gate electrode connected to said second input terminal;
   means for coupling said junction to said reference terminal, said coupling means having a substantially higher resistive value than said third MOSFET in the operative condition of each; and
   means for applying a signal to the gate electrode of said first MOSFET;
   whereby power normally provided to said output terminal from said first input terminal through said first MOSFET is supplied from said second input terminal through said second MOSFET whenever the magnitude of the potential on said first input terminal falls below that on said second input terminal.

5. A power supply switching circuit as set forth in claim 4 wherein said coupling means comprises a MOSFET of a second conductivity type, said lastrecited MOSFET including an input electrode connected to said reference terminal, an output electrode connected to said junction, and a gate electrode connected to said second input terminal.

6. A power supply switching circuit as set forth in claim 5 and further comprising a CMOS inverter, said inverter including:
   a first inverter power supply terminal connected to said reference terminal;
   a second inverter output terminal connected to said output terminal of said circuit;
   an inverter input terminal connected to said junction; and
   an inverter output terminal connected to the gate electrode of said first MOSFET;
   whereby said signal applied to said gate electrode of said first MOSFET is provided by said inverter and the turn-on voltage of said first MOSFET is maximized.

7. An integrated power supply switching circuit as set forth in claims 5 or 6 and further comprising:
   first and second MOSFET body switches of said first conductivity type;

said body switches each including a input electrode, an output electrode and a gate electrode;

a common body shared by said first, second and third MOSFETs and by said first and second body switches;

the input electrodes of said first and second body switches being connected to said common body;

the output electrode of said first body switch being connected to the input electrode of said second MOSFET;

the gate electrode of said first body switch being connected to said junction, whereby said first body switch is enabled to open and close in unison with said second MOSFET;

the output electrode of said second body switch being connected to the input electrode of each of said first and third MOSFETs; and the gate electrode of said second body switch being connected to the gate electrode of said first MOSFET;

whereby forward biasing of the intrinsic p-n junction in any of said first, second or third MOSFETs is precluded.

8. The combination of a power supply switching circuit and a real time clock monolithically integrated on a single chip, said combination comprising:

first and second input terminals;

an output terminal;

a reference terminal adapted to provide a reference potential;

means for applying a first DC voltage of a first polarity to said first input terminal;

means for applying a second DC voltage of said first polarity to said second input terminal;

said real time clock being connected between said output terminal and said reference terminal;

first, second and third MOSFETs of a first conductivity type;

first and second MOSFET body switches of said first conductivity type;

said MOSFETs and body switches jointly sharing a common body and each including an input electrode, an output electrode and a gate electrode;

said output electrodes of said first and second MOSFETs being connected to said output terminal;

said input electrodes of said first and third MOSFETs being connected to said first input terminal;

said input electrode of said second MOSFET being connected to second input terminal;

said gate electrode of said second MOSFET and said output electrode of said third MOSFET being connected to one another to form a junction;

said gate electrode of said third MOSFET being connected to said second input terminal;

means for coupling said junction to said reference terminal, said coupling means exhibiting a resistive value in its operative state of at least an order of magnitude greater than that exhibited by said third MOSFET in the operative state of the latter;

said output electrodes of said first and second body switches being connected to said common body;

said gate electrode of said first body switch being connected to said junction;

said output electrode of said first body switch being connected to said input electrode of said second MOSFET;

said output electrode of said second body switch being connected to said input electrodes of said first and third MOSFETs; and means for jointly applying an electrical signal to the gate electrodes of said first MOSFET and said second body switch;

whereby said switching circuit is responsive to the relative polarities of the DC voltages applied to said first and second input terminals to couple said output terminal to said first or second input terminal through said first or second MOSFET respectively.

9. The combination as set forth in claim 8, wherein said coupling means comprises a MOSFET of a second conductivity type, said last-recited MOSFET including an input electrode connected to said reference terminal, an output electrode connected to said junction, and a gate electrode connected to said second input terminal;

whereby said last-recited MOSFET remains conductive regardless of the relative polarities of said first and second input terminals.

10. The combination as set forth in claim 9, wherein said means for jointly applying a signal to the gate electrodes of said first MOSFET and said second body switch comprises a CMOS inverter, said inverter comprising:

a first inverter power supply terminal connected to said reference terminal;

a second inverter power supply terminal connected to said output terminal of said circuit;

an inverter input terminal connected to said junction; and an inverter output terminal connected to the gate electrodes of said first MOSFET, and said second body switch, said inverter output terminal being further connected to an input of said real time clock and adapted to apply a control signal thereto; and whereby the signal applied to said gate electrode of said first MOSFET is provided by said inverter and the turn-on voltage of said first MOSFET is maximized.

11. The combination as set forth in claim 9 or 10, wherein said MOSFETs and said body switches of said first conductivity type are n-channel devices, and said MOSFET of said second conductivity type is a p-channel device.

12. The combination as set forth in claim 9 or 10, wherein said MOSFETs and said body switches of said first conductivity type are p-channel devices, and said MOSFET of said second conductivity type is an n-channel device.

13. A power supply switching circuit for switching a load from a main power supply of a main unidirectional voltage to an auxiliary power supply of an auxiliary unidirectional voltage of a same polarity as said main voltage, said main and auxiliary power supplies being coupled together at a reference node and said main voltage having a greater amplitude than said auxiliary voltage with respect to said reference node, said power supply switching circuit comprising:

a reference terminal adapted to be coupled to said reference node;

a main terminal adapted to be coupled to said main power supply;

a auxiliary terminal adapted to be coupled to said auxiliary power supply;

first, second and third transistor switches, all of a first conductivity type, each transistor having a first and second electrode with current flow between said first and second electrodes and a control electrode controlling said flow of current between said first and second electrodes;

a high impedance device having at least two terminals, said high impedance device having a substantially higher impedance than said third transistor switch when both said high impedance means and third transistor switch are conducting;

said first electrodes of said first and third transistor switches being coupled to said main terminal;

said second electrodes of said first and second transistor switch being coupled together to form an output node;

said control electrode of said third transistor switch and said first electrode of said second transistor switch being coupled to said auxiliary terminal;

said second electrode of said third transistor switch being coupled to a terminal of said high impedance device forming a first junction and said other terminal of said high impedance device being coupled to said reference terminal;

amplifier means having a high gain for coupling said first junction to said control electrode of said second transistor switch; and biasing means for coupling said control electrode of said first transistor switch to a voltage having a lesser amplitude and said same polarity as said main voltage.

14. A power supply switching circuit as described in claim 13 wherein said high impedance device is a fourth transistor switch of a second conductivity type, said second conductivity type transistor switch having a control electrode for controlling flow of current between said first and second device terminals and wherein said control electrode of said fourth transistor switch is coupled to said auxiliary terminals.

15. A power supply switching circuit as described in claim 13, wherein said amplification means comprises two inverters coupled in series, each inverter having an input and an output, wherein said output of said first inverter is coupled to said input of said second inverter and said input of said first inverter is coupled to said first junction and said control electrode of said second transistor switch is coupled to said output of said second inverter.

16. A power supply switching circuit as described in claim 15 wherein said biasing means comprises means for coupling said control electrode of said first transistor switch to said output of said first inverter.

17. A power switching supply circuit as described in claim 16 wherein said power supply switching circuit includes a third inverter having an input and an output, said input of said third inverter being coupled to said output of said second inverter and said output of said third inverter being coupled to said input of said second inverter, thereby forming a feedback loop.

18. A power supply switching circuit as described in claim 13, wherein said biasing means comprises a biasing inverter having an input and an output, wherein said input of said biasing inverter is coupled to said said first junction and said control electrode of said first transistor switch is coupled to said output of said biasing inverter.

19. A power supply switching circuit as described in claim 17, wherein each of said inverters comprises:

a pair of inverter transistors, a first inverter transistor of said first conductivity type and a second inverter transistor of said second conductivity type with each inverter transistor having a first and second electrode between which current flows and a control electrode controlling said current flow between said first and second electrodes; and wherein said control electrodes of both inverter transistors are coupled together to form said input of each inverter, said first electrode of said first inverter transistor is coupled to said second electrode of said second transistor switch and said first electrode of said second inverter transistor is coupled to said reference terminal and wherein said second electrode of both of said inverter transistors is coupled together forming said output electrode of each said inverter.

20. A power supply circuit of the type described in claim 19, wherein all of the components of said power supply circuit are contained in an integrated circuit.

21. A power supply circuit of the type described in claim 13, wherein said biasing means comprises a conducting path coupled to said auxiliary terminal.

22. A power supply switching circuit for switching a load from a main power supply of a main unidirectional voltage to an auxiliary power supply of an auxiliary unidirectional voltage of a same polarity as said main voltage, said main and auxiliary power supplies being coupled together at a reference node and said main voltage having a greater amplitude than said auxiliary voltage with respect to said reference node, said power supply switching circuit comprising:

a reference terminal adapted to be coupled to said reference node;

a main terminal adapted to be coupled to said main power supply;

a auxiliary terminal adapted to be coupled to said auxiliary power supply;

first, second and third transistor switches, all of a first conductivity type, each transistor having a first and second electrode with current flow between said first and second electrodes and a control electrode controlling said flow of current between said first and second electrodes;

a high impedance device having at least two terminals, said high impedance device having a substantially higher impedance than said third transistor switch when both said high impedance means and third transistor switch are conducting;

said first electrodes of said first and third transistor switches being coupled to said main terminal;

said second electrodes of said first and second transistor switch being coupled together to form an output node;

said control electrode of said third transistor switch and said first electrode of said second transistor switch being coupled to said auxiliary terminal;

said second electrode of said third transistor switch being coupled to a terminal of said high impedance device forming a first junction and said other terminal of said high impedance device being coupled to said reference terminal;

a conducting path coupling said junction to said control electrode of said second transistor switch; and biasing means for coupling said control electrode of said first transistor switch to a voltage having a lesser amplitude and said same polarity as said main voltage.

* * * * *